United States Patent
Hess et al.

(10) Patent No.: US 7,024,642 B2
(45) Date of Patent: Apr. 4, 2006

(54) EXTRACTION METHOD OF DEFECT DENSITY AND SIZE DISTRIBUTIONS

(75) Inventors: Christopher Hess, San Ramon, CA (US); David Stashower, Los Gatos, CA (US); Brian E. Stine, Santa Clara, CA (US); Larg H. Weiland, San Ramon, CA (US); Richard Burch, McKinney, TX (US); Dennis J. Ciplickas, San Jose, CA (US)

(73) Assignee: PDF Solutions, Inc., San Jose, CA (US)

( * ) Notice: Subject to any disclaimer, the term of this patent is extended or adjusted under 35 U.S.C. 154(b) by 258 days.

(21) Appl. No.: 10/471,775

(22) PCT Filed: Mar. 12, 2002

(86) PCT No.: PCT/US02/07409

§ 371 (c)(1),
(2), (4) Date: Sep. 12, 2003

(87) PCT Pub. No.: WO02/073661

PCT Pub. Date: Sep. 19, 2002

(65) Prior Publication Data

US 2004/0094762 A1    May 20, 2004

Related U.S. Application Data

(60) Provisional application No. 60/275,190, filed on Mar. 12, 2001.

(51) Int. Cl.
*G06F 17/50* (2006.01)
*G06F 9/45* (2006.01)
*H01L 23/58* (2006.01)
(52) U.S. Cl. .................... 716/4; 257/48; 716/5; 716/19
(58) Field of Classification Search .................... None
See application file for complete search history.

(56) References Cited

U.S. PATENT DOCUMENTS 3,983,479 A     9/1976  Lee et al.
4,739,388 A *   4/1988  Packeiser et al. ............. 257/48

FOREIGN PATENT DOCUMENTS

EP        0 213 409 A1    3/1987

OTHER PUBLICATIONS

Khare et al., "Extraction of Defect Characteristics for Yield Estimation Using the Double Bridge Test Structure," 1991 VLSITSA, pp. 428-432.*

(Continued)

*Primary Examiner*—Leigh M. Garbowski
(74) *Attorney, Agent, or Firm*—Duane Morris LLP

(57) ABSTRACT

A characterization vehicle includes a substrate having at least one layer (300), and a plurality of pairs of nested serpentine lines on a single surface of a single layer of the substrate (301a . . . 301h, 302a . . . 302h), each pair of nested serpentine lines having a shared pad between them (312a . . . 312h).

24 Claims, 14 Drawing Sheets

OTHER PUBLICATIONS

Khare et al., "Yield-Oriented Computer-Aided Defect Diagnosis," IEEE Transactions on Semiconductor Manufaturing, vol. 8, No. 2, May 1995, pp. 195-206.*

Nurani et al., "In-Line Yield Prediction Methodolgies Using Patterned Wafer Inspection Information," IEEE Transactions on Semiconductor Manufacturing, vol. 11, No. 1, Feb. 1998, pp. 40-47.*

Sayah et al., "Comb/Serpentine/Cross-Bridge Test Structure for Fabrication Process Evaluation," 1988 IEEE Porceedings on Microelectronic Test Structures, vol. 1, No. 1, pp. 23-28.*

Hess et al., "Fast Extraction of Killer Defect Density and Size Distribution Using a Single Layer Short Flow NEST Structure" Proceedings of International Conference on Microelectronic Test Structures, Mar. 13, 2000, pp. 57-62, IEEE Piscataway, NJ, USA, XP-002953735.

Supplementary European Search Report, Application No. EP 02 71 5098, Apr. 15, 2005.

Reinhard Glang et al., "Defect Size Distribution In VLSI Chips," IEEE Transactions on Semiconductor Manufacturing, Nov. 1991, pp. 265-269, vol. 4. No. 4.

Christopher Hess et al., "Customized Checkerboard Test Structures to Localize Interconnection Point Defects," Proc. 1997 VLSI Multilevel Interconnection Conference, Jun. 1997, 6 pp., Vo. 14.

Christopher Hess et al., A Digital Tester Based Measurement Methodology for Process Control in Multilevel Metallization Systems, SPIE, Oct. 1995 vol. 2637.

Christopher Hess et al., "Harp Test Structure to Electrically Determine Size Distributions of Killer Defects," IEEE Transactions on Semiconductor Manufacturing, May 1998, pp. 194-203, vol. 11, No. 2.

Jitendra B. Khare, "Extraction of Defect Size Distributions in an IC Layer Using Test Structure Data," IEEE Transactions on Semiconductor Manufacturing, Aug. 1994, pp. 354-368, vol. 7, No. 3.

Charles H. Stapper, "Integrated Circuit Yield Management and Yield Analysis: Development and Implementation," IEEE Transactions on Semiconductor Manufacturing, May 1995, pp. 95-102, vol. 8, No. 2.

Communication from European Patent Office dated Jun. 23, 2005.

* cited by examiner

EXTRACTION METHOD OF DEFECT DENSITY AND SIZE DISTRIBUTIONS

This application claims the benefit of U.S. Provisional Application 60/275,190, filed Mar. 12, 2001.

FIELD OF INVENTION

This invention relates to methods for measuring and evaluating the process and design related statistical variations of an integrated circuit manufacturing process in order to determine their sources and their effects on the yield and performance of the product.

BACKGROUND

Defects (e. g. particles) can cause electrically measurable faults (killer defects) dependent on the chip layout and the defect size. These faults are responsible for manufacturing related malfunction of chips. So, defect density and size distributions are important for yield enhancement and to control quality of process steps and product chips, as described in Staper, C. H., Rosner, R. J., "Integrated Circuit Yield Management and Yield Analysis: Development and Implementation," IEEE Transactions on Semiconductor Manufacturing, pp. 95–102, Vol. 8, No. 2, 1995.

Test structures are used to detect faults and to identify and localize defects. The double bridge test structure was proposed by Khare, et al., "Extraction of Defect Size Distributions in an IC Layer Using Test Structure Data," IEEE Transactions on Semiconductor Manufacturing, pp. 354–368, Vol. 7, No. 3, 1994, to extract size distributions based on electrical measurements. This test structure design requires two conducting layer having different resistivity. Thus, this design requires at least one polysilicon layer and one metal layer. The Harp test structure was proposed by Hess, C., Weiland, L. H., "Harp Test Structure to Electrically Determine Size Distributions of Killer Defects," IEEE Transactions on Semiconductor Manufacturing, pp. 194–203, Vol. 11, No. 2, 1998, which may be used for any kind of layers, but even the harp test structure requires at least two layers, which may slow down the data extraction procedure.

Parallel lines—each connected to two pads—are implemented inside a test structure to electrically determine a defect size distribution. If a defect occurs and causes an electrically measurable fault, either two or more test structure lines are shorted or one or more test structure lines are opened. The greater the number of test structure lines involved, the larger the defect that caused this measured fault.

FIG. 1 shows the principle design of such nested serpentine lines, which is based on a structure proposed by Glang, R., Defect Size Distribution in VLSI Chips, "IEEE Transactions on Semiconductor Manufacturing," pp. 265–269, Vol. 4, No. 4, 1991. FIG. 1 shows a structure 100 having a plurality of nested serpentine lines 102a–102n, where n is the number of lines 102a–102n. Each line 102a–102n includes a pair of pads 104a–104n and 105a–105n, respectively. Thus, a pair of lines (e.g., 102a, 102b) requires four pads (e.g., 104a, 105a, 104b, 105b).

Glang used 5 serpentine lines within two combs, and implemented several structures having different dimensions to determine a defect size distribution by comparing the number of detected defects dependent on the dimension of the structures. Having a high number of nested serpentine lines enables the direct extraction of defect size distribution by comparing the number of detected defects dependent on the number of involved lines.

Each NEST structure is connected to a 2-by-N pad frame. FIG. 2 shows a complete NEST structure design, which was automatically generated in just a few seconds. This exemplary NEST structure 200 includes 3104 parallel lines in a single metal layer.

In a 2-by-N pad frame the number of pads is very limited. To enable the detection of opens and shorts, each test structure line is connected to two pads. So, only N/2 lines may be implemented; that does not fill a relatively large chip area that is sufficient to detect random defects. For this reason, the lines are designed as serpentines to fill the complete test chip area. Nevertheless, an improved structure allowing a larger number of lines is desired.

SUMMARY OF THE INVENTION

One aspect of the invention is a characterization vehicle, comprising a substrate having at least one layer, and a plurality of pairs of lines on a single surface of a single layer of the substrate, each pair of lines having a shared pad therebetween.

Another aspect of the invention is a method of designing a characterization vehicle, comprising the steps of: arranging a plurality of pairs of lines on a single surface of a single layer of a substrate; and locating a respective shared pad between the lines of each pair of lines.

Another aspect of the invention is a method of identifying defects, comprising the steps of: fabricating a characterization vehicle by forming a plurality of pairs of lines on a single surface of a single layer of a substrate, each pair of lines having a shared pad therebetween; and collecting defect data from the characterization vehicle.

Yet another aspect of the invention is a method of determining defect size distributions, comprising the steps of: collecting defect size distributions from a characterization vehicle by forming a plurality of pairs of lines on a single surface of a single layer of a substrate, each pair of lines having a shared pad therebetween; and determining which one of a pair of sharing a pad therebetween has a defect by identifying a sequence of the that are shorted together.

DETAILED DESCRIPTION

U.S. patent application Ser. No. 09/442,699, filed Nov. 18, 1999, now U.S. Pat. No. 6,449,749, issued Sept. 10, 2002. is incorporated by reference herein as though set forth in its entirety.

Defect inspection is required for process control and to enhance chip yield. Electrical measurements of test structures are commonly used to detect faults. To improve accuracy of electrically based determination of defect densities and defect size distributions, an exemplary NEST structure has a plurality of nested serpentine lines. In one preferred embodiment, the plurality of nested serpentine lines are placed within a single layer. In the preferred embodiment, this mask can be used as a short flow to provide a short turn-around time for fast process data extraction. Data analysis procedures provide densities and size distributions of killer defects that have an impact on product chip yield. There is no limitation regarding layer specific properties, such as sheet resistance, and no requirement of any semiconductor devices to separate test structure lines or separate multiple faults, respectively. The NEST structure detects systematic problems as well as random defects to determine accurate defect densities and size distributions.

To enable the shortest possible manufacturing time, the inventors have developed a short loop test structure that can use just one mask step (to form a single metal layer) to enable a fast extraction of densities and size distributions of killer defects that have a detrimental impact on the yield of product chips.

Test Structure Design

The following sections describe a NEST test structure, followed by some design guidelines that can be applied to improve both the NEST structures of any of FIGS. 1–5, and other types of NEST structures.

PD NEST Structure Design

Figure 1:
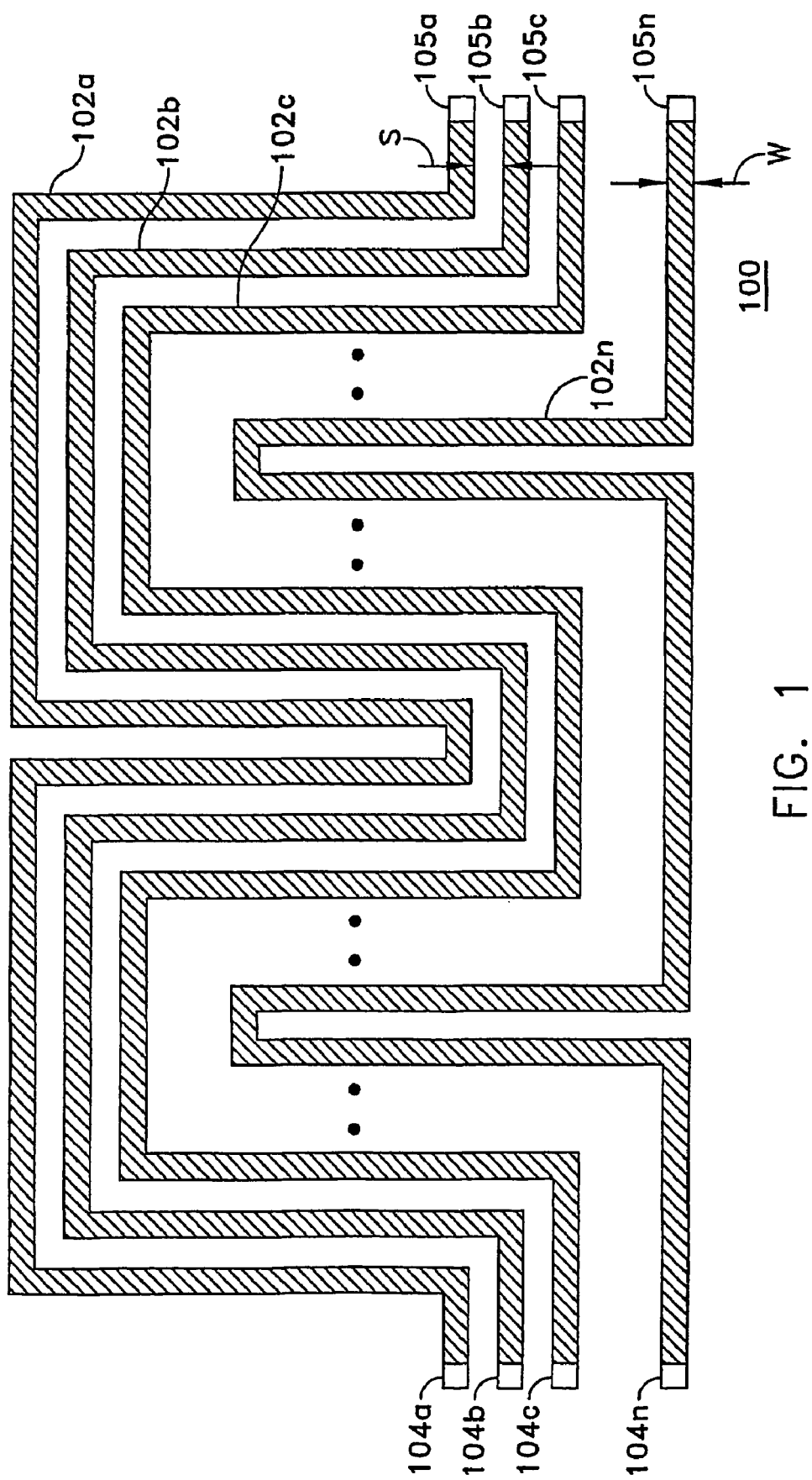
FIG. 1 is a diagram of an exemplary single layer NEST structure.
Figure 2:
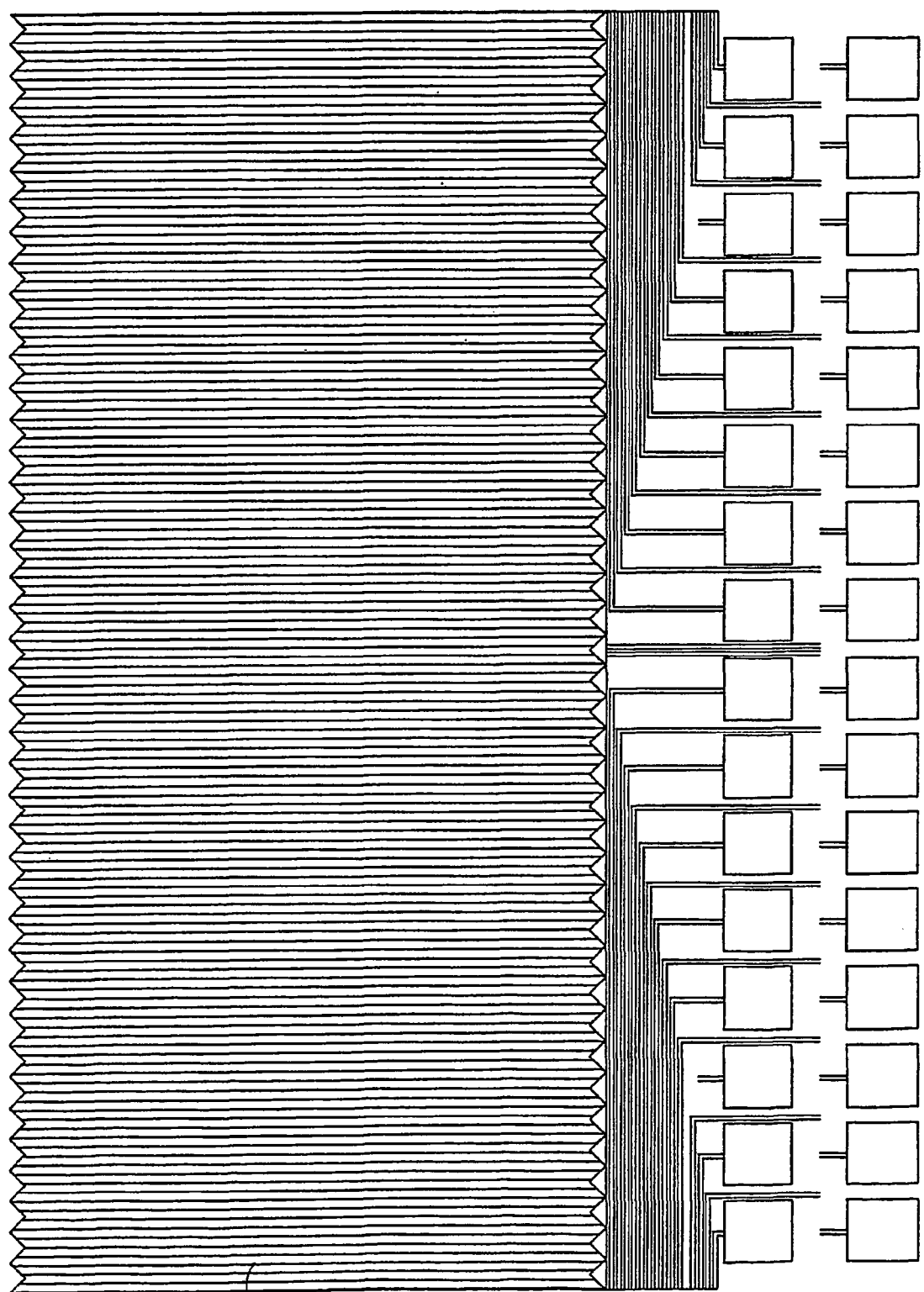
FIG. 2 is a diagram showing an exemplary design for a NEST structure having a large number of parallel lines in a single layer.
Figure 3:
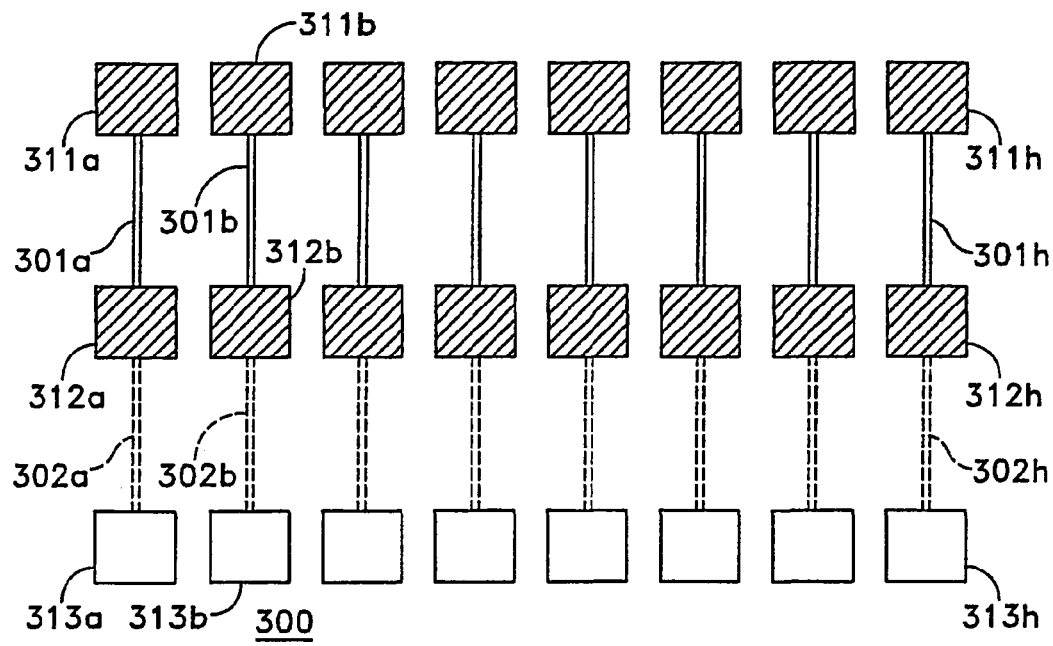
FIG. 3 is a diagram showing an exemplary placement of lines sharing pads in the center.

To further improve the NEST structure some sharing of pads can be incorporated, as shown in FIG. 3. FIG. 3 is a diagram in which the nested lines of the NEST structure are represented by straight lines, for easier visualization. It is understood that each line 301a–301h and 302a–302h represents a respective nested serpentine line. As shown in FIG. 3, two lines may be connected to three pads (instead of four in the regular NEST structure of FIG. 1), sharing a center pad between them. For example, line 301a is connected to top pad 311a and center pad 312a, and line 302a is connected to bottom pad 313a and the same center pad 312a. For each respective pair of lines including a top line 301a–301h and bottom line 302a–302h, there is a respective top pad 311a–311h, a center pad 312a–312h and a bottom pad 313a–313h. So, for a given number M of pads in a 2-by-N pad frame, 2*integer(M/3) lines can be implemented in a PD NEST structure instead of just N lines in a regular NEST structure. For example, as shown in FIG. 3, 16 lines can be implemented in a PD NEST. As another example (not shown), in a 2-by-15 pad frame, 20 lines may be implemented in a PD NEST structure, instead of just 15 lines in a regular NEST structure. In other words, 25% fewer pads are needed to hook up the same number of lines, which results in less test time due to less pad frame stepping time as well as significantly better usage of given chip area.

If a defect results in an open line, it can be clearly detected, either between a pad on the top and a center pad, or between a pad on the bottom and a center pad. However, for the configuration of FIG. 3, a defect in one or more of lines 301a–301h that causes a short circuit on the top side is also measurable on the bottom side. To even separate those defects, the neighborhood relationship of the lines on the first (e.g., left) side and the second (e.g., right) side are changed using the Permutation Procedure described at Hess, C., Weiland, L. H., "Harp Test Structure to Electrically Determine Size Distributions of Killer Defects," IEEE Transactions on Semiconductor Manufacturing, pp. 194–203, Vol. 11, No. 2, 1998, which is incorporated by reference herein, and described in pertinent part below. Because there are only two sets of lines (top and bottom in FIG. 3, or right and left in other configurations), only two rows of the 2D-matrix are calculated by the Permutation Procedure.

Parallel lines—each connected to an isolated pad—are implemented inside a test structure to electrically determine a defect size distribution. If a defect occurs and causes an electrically measurable fault, two or more test structure lines are shorted. The more test structure lines are shorted together, the larger the defect is. But, if more than two serpentine lines are connected, it is difficult to say whether there is just one large defect or some small defects have caused a multiple fault. Short circuits will connect test structure lines if, and only if, the lines are placed as neighbors anywhere inside the test chip area. So, the more different neighbored test structure lines are implemented the more short circuits are distinguishable.

The permutation procedure increases the number of differently neighbored test structure lines without increasing the number of pads. An undesigned short circuit defect is detectable between test structure lines connected to electrically distinguishable pads. For that, it is not necessary to give each test structure line an individual pad, but each pair of parallel test structure lines are connected to a unique set of pads. For this reason, all possible neighborhood relationships of adjacent lines are arranged inside a test chip no more than once.

Let a[2,j] be the index of the $j^{th}$ line in bottom (second) set of lines. Assuming that the first sequence of line numbers is simply the set of positive integers (1, 2, 3, . . . ), the number m of used index values is an even integer $$(\frac{m}{2} \in N),$$

and j is the position of the index within the second sequence, the second sequence is given by:

$$a[2,j] = \begin{cases} j+2 & \text{if } j \text{ is even and } \frac{m-j+2}{2} \geq 2 \\ 2*m-j-1 & \text{if } j \text{ is even and } \frac{m-j+2}{2} < 2 \\ 3-j & \text{if } j \text{ is odd and } \frac{j+1}{2} < 2 \\ j-2 & \text{if } j \text{ is odd and } \frac{j+1}{2} \geq 2 \end{cases}$$

Figure 4:
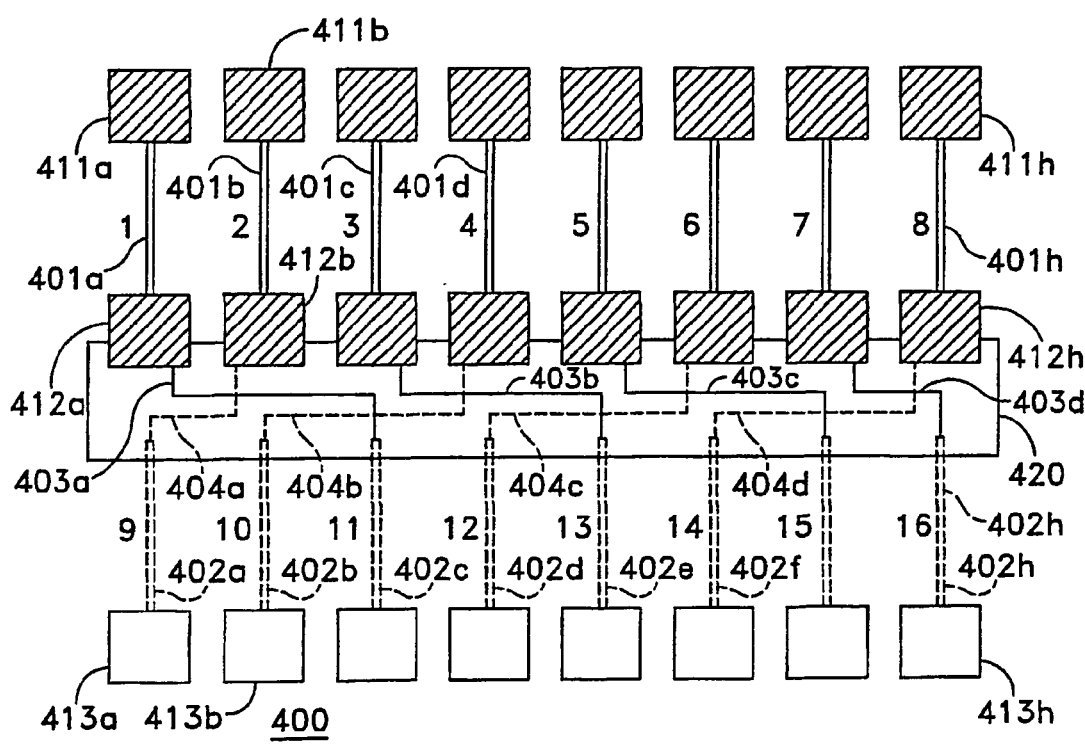
FIG. 4 is a diagram showing the bottom lines routed according to an exemplary permutation procedure.

Thus, as shown in FIG. 4, the second sequence from the above equation is 2-4-1-6-3-8-5-7. Thus, if the top sequence of lines is 1-2-3-4-5-6-7-8, the bottom sequence of lines is 2-4-1-6-3-8-5-7. In the bottom row, the first line has the index "2", indicating that the first bottom line shares a pad with (and is electrically connected to) the second line in the top set of lines. In the bottom row, the second line has the index "4", indicating that the line shares a pad with the fourth line in the top set of lines. In the bottom row, the third line has the index "1", indicating that the line shares a pad with the first line in the top set of lines. In the bottom row, the fourth through eighth lines have the indices "6", "3," "8," "5," and "7", respectively, indicating that the lines share respective pads with the $6^{th}$, $3^{rd}$, $8^{th}$, $5^{th}$ and $7^{th}$ lines, respectively, in the top set of lines.

One of ordinary skill can readily determine the second sequence of lines by applying the above equations, for any even integer m (number of bottom lines). Using this sequence, each bottom line with index a[2j] has one or two neighboring lines with indices a[2,j−1] and/or a[2,j+1]. The corresponding top line a[1,j], which shares a pad with line a[2,j] has one or two neighboring lines with indices a[1,j−1] and/or a[1,j+1]. The following inequalities hold for every value of j:

$a[2,j-1] \neq a[1,j-1]$ $a[2,j-1] \neq a[1,j+1]$ $a[2,j+1] \neq a[1,j-1]$ $a[2,j+1] \neq a[1,j+1]$ In other words, for each pair of top and bottom (or first and second, or right and left) lines having the index j, the adjacent neighboring lines are disjoint. Each relationship between neighboring line indices appears at most one time. This makes it possible to uniquely identify whether a short circuit between line j and one of its neighbors affects the top line a[1,j] or the bottom line a[2,j].

FIG. 4 shows an example for 2*8 lines. As in FIG. 3, there are top pads 411a–411h, center pads 412a–412h and bottom pads 413a–413h, with top lines 401a–401h and bottom lines 402a–402h. The example of FIG. 4 adds a routing channel 420 with connecting lines 403a–403d and 404a–404d. Beside each line 401a–401h and 402a–402h, the "Permutation index" can be seen. In the example, the bottom lines 402a–402h are rearranged so that each line has a Permutation index next to it that is different from its ordinal position in the sequence of bottom lines. (i.e., the first line 402a does not have the permutation index "1," the second line 402b does not have the permutation index "2," etc.) Also, the arrangement of the permutation indices is such that no bottom line 402a–402h is adjacent to a line having the closest greater or lesser permutation index. For instance, the top line 401c (permutation index "3") is adjacent to the top line 401b (permutation index "2") and top line 401d (permutation index "4"), but the bottom line 402e (permutation index "3") is adjacent to the bottom line 402d (permutation index "6") and bottom line 402f (permutation index "8"). The different neighborhood relationships provide easy separation of defects that result in shorts in the top lines 401a–401h and bottom lines 402a–402h.

To change the order of indices, a routing channel 420 can be provided, as seen in FIG. 4. The routing channel 420 as drawn in FIG. 4 includes crossings 403a–403d and 404a–404d that are not available on a single mask. The inventors have determined that the complete routing can be implemented without crossings, if broken apart into two groups—the set of all solid routing lines 403a–403d shown in FIG. 4 and the set of dashed routing lines 404a–404d.

Figure 5:
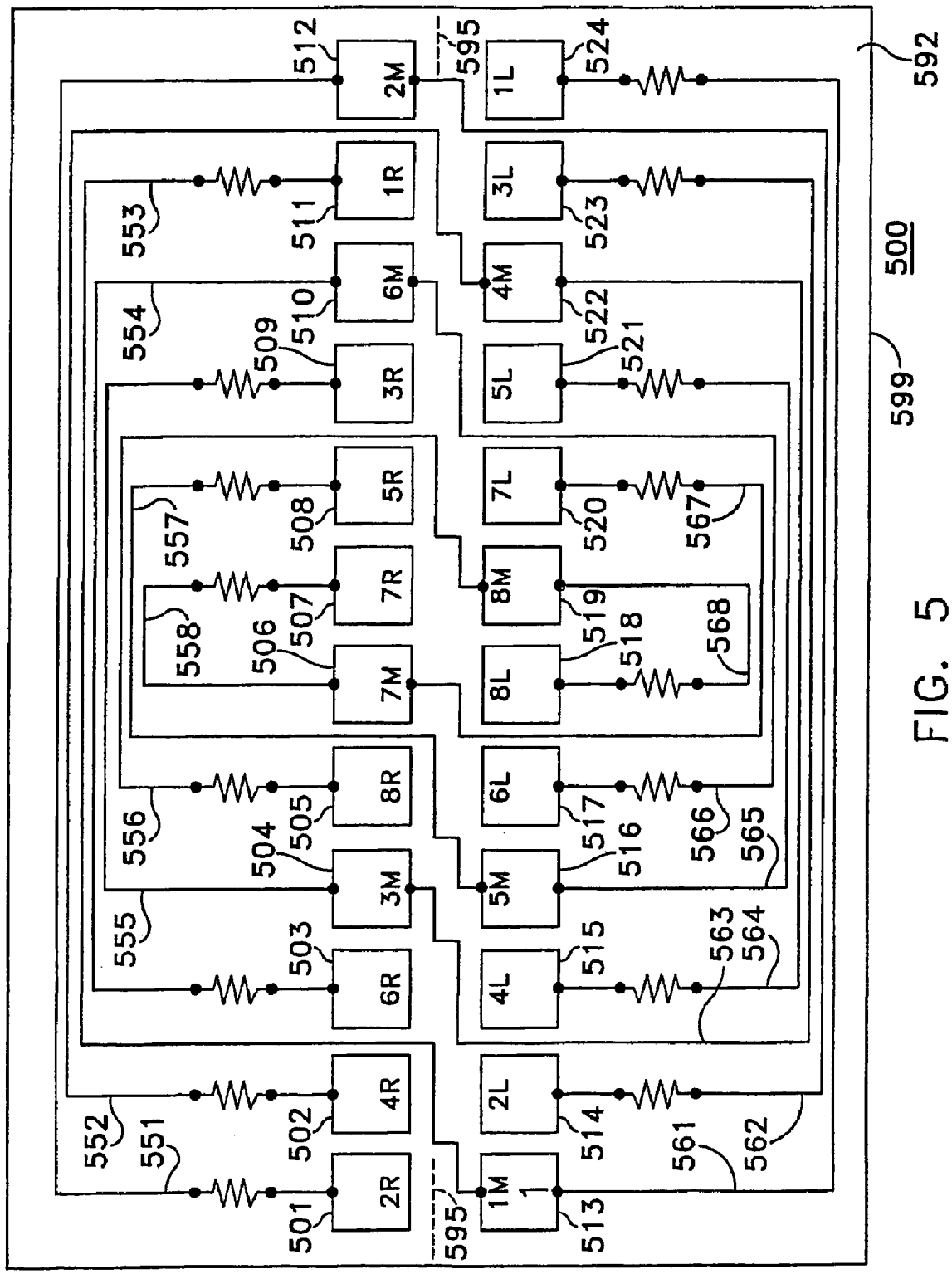
FIG. 5 is a diagram showing a further exemplary type of NEST structure.

FIG. 5 is a diagram of a characterization vehicle 500 comprising a substrate 599 having at least one layer, and a plurality of pairs of nested serpentine lines 501–524 on a single surface of a single layer of the substrate, each pair of nested serpentine lines having a shared pad 1M–8M therebetween.

FIG. 5 is an exemplary routing of the set of lines in FIG. 4, wherein the nested serpentine lines are drawn. In FIG. 5, the bottom set of lines are sequentially numbered "1" through "8", and the top set of lines are numbered by the sequence 2-4-1-6-3-8-5-7. Thus, in FIG. 5, the top set of lines is the second set and bottom set of lines is the first set. This is the opposite of FIG. 4, in which the top set is the first set and the bottom set is the second set.

The characterization vehicle 500 comprises a substrate 599 having at least one layer with a first (top) side 519 above line 595 and a second (bottom) side 592 below line 595. A first row of pads 501–512 is on the first side 591 of the substrate 599. A second row of pads 513–524 is on the second side 592 of the substrate 599. A plurality of pairs of nested serpentine lines (551 and 562, 552 and 564, 553 and 561, 554 and 566, 555 and 563, 556 and 568, 557 and 565, 558 and 567) are on the substrate. The pairs of pads are designated 1L and 1R, 2L and 2R, . . . , 8L and 8R. The designations L and R signify "left" and "right," but these designations are arbitrary, and do not require a particular orientation of the patterns or of the characterization vehicle 500. L could alternatively correspond to "right," "bottom" or "top" and R could correspond to "left," "top" or "bottom," so long as L and R correspond to two different sides.

Each pair of nested serpentine lines has a shared pad 1M–8M (items 513, 512, 504, 522, 516, 510, 506 and 519, respectively) therebetween. Each pair (e.g., 551 and 562) of nested serpentine lines 501–524 includes a first line (e.g., 551) and a second line (e.g., 562), such that: the first line (e.g., 551) extends beyond the first row of pads 501–512 on the first side 591 of the substrate 599, and the second line (e.g., 562) extends beyond the second row of pads 513–524 on the second side 592 of the substrate 599.

FIG. 5 is an example of one such routing. In FIG. 5, the three sets of pads (top, center and bottom) of FIG. 4 are rearranged to fit in two rows of pads. One routing set is placed in one half of a 2-by-N pad frame (e.g. top row of pads 501–512 drawn 2-by-N in FIG. 5), while the other routing set is placed in the other part of a 2-by-N pad frame (e.g., the bottom row of pads 513–524 horizontally drawn 2-by-N in FIG. 5). The top row of pads 501–512 includes "right" pads designated IR to 8R, and "middle" pads designated 2M, 3M, 6M and 7M. The bottom row of pads 513–524 includes "left" pads designated 1L to 8L, and "middle" pads designated 1M, 4M, 5M and 8M. Note that the designations top, bottom, left and right refer only to the positions in the drawings. Configurations can be readily implemented in which top and bottom positions are substituted for right and left, or vice-versa.

In FIG. 5, the permutation indices 1R–8R, 1M–8M and 1L–8L indicate which pads are connected to each other. Pads having the same number in their respective indices are connected. No pad is positioned directly opposite a pad to which it is connected. For example, pad 512 (permutation index 2M) is connected to pad 501 (permutation index 2R) and pad 514 (permutation index 2L).

Using this routing scheme leads to an exemplary embodiment of the PD NEST structure as an example for 2*8 lines can be seen in FIG. 5. Now, the indices of the lines that are shorted together indicates whether the defect can be found in the upper or lower section of the PD NEST structure. For example, if only lines connected to pads having the permutation indices 2 and 4 are shorted together, then the short circuit must be on the top half of the configuration, between the lines 551 and 552 connected to pads 501 and 502, respectively. If, however, only lines connected to pads having the permutation indices 2, 3 and 4 are all shorted together, then the short circuit must be on the bottom half of the configuration, among lines 562, 563 and 564.

Although the preferred embodiment of FIG. 5 includes nested serpentine lines, one of ordinary skill could implement other test structures using the techniques described herein. For example, comb structures or any other test structures capable of measuring shorts, or combinations thereof (e.g., comb and nest), may be implemented instead of nested serpentine lines.

It is also understood that placing the lines 551–558, 561–568 and pads 501–524 on a single surface of a single layer of the characterization vehicle 599 does not prevent the characterization vehicle from having other layers. Thus, the configuration shown in FIG. 5 (or another configuration of pads and nested serpentine lines can be included on one surface of a characterization vehicle having additional layers.

Design Guidelines

To design a NEST structure there are three main design guidelines:

To prevent the problem of separating multiple defects within a NEST structure, the area per NEST structure should be limited such that on average no more than one defect is expected within two NEST structures.

To keep the NEST structure measurable, the resistance value per line should be within the limits given by the testing equipment.

Finally, testing time should be within a given limit per wafer, which gives the maximum number of pad frames and NEST structures that may be implemented within a die.

Given today's low expected defect densities, testing time usually is the main limitation for analog DC measurements using a parametric tester. For digital testing as described at Hess, C., Weiland, L. H., "A Digital Tester Based Measurement Methodology for Process Control in Multilevel Metallization Systems", Proc. 1995 SPIE's Microelectronic Manufacturing, Vol. 2637, pp. 125–136, 1995, the line resistance usually is the main limitation for the NEST structure design.

Testing Procedure

Open circuits are tested by measuring the resistance between the two pads connected to a single line of a NEST or PD NEST structure. A given NEST or PD NEST structure of M lines will result in a vector with M values each standing for a detected open line. The order of the values in the vector corresponds to the sequential order of the lines within the NEST structure. For instance, the vector $\{0,0,1,0,0,0,0,0,1,1,1,0,0,0,0,\}$ of a NEST structure containing M=16 lines indicates that there are two defects causing open circuits. One open circuit is caused by a defect interrupting the lines 3 and 4. The second open circuit is caused by a defect interrupting the lines 10, 11, and 12. Because the area of the configuration is relatively small, it is assumed that a single defect accounts for the opens in lines 3 and 4, and another single defect accounts for the opens in lines 10, 11 and 12.

Short circuits are tested by measuring the resistance between two pads connected to adjacent lines. A given NEST structure of M lines results in a vector with M values each standing for a line being involved in a short circuit. The order of the values in the vector corresponds to the order of the lines within the NEST structure. For instance, the vector $\{0,0,0,0,0,1,1,1,0,0,0,0,0,1,1,0\}$ of a NEST structure containing M=16 lines indicates that there are two short circuits. One short circuit is caused by a defect connecting the lines 6, 7, and 8. The second short circuit is caused by a defect connecting the lines 14 and 15.

In a PD NEST structure one determines whether the top or bottom side of the structure contains the defect. For this purpose, the algorithm described at Hess, C., Weiland, L. H., "Harp Test Structure . . .", 1998, can be applied taking just two rows of the Permutation Procedure into account. Once the side is known, it is handled the same way as the regular NEST structure.

Figure 15:
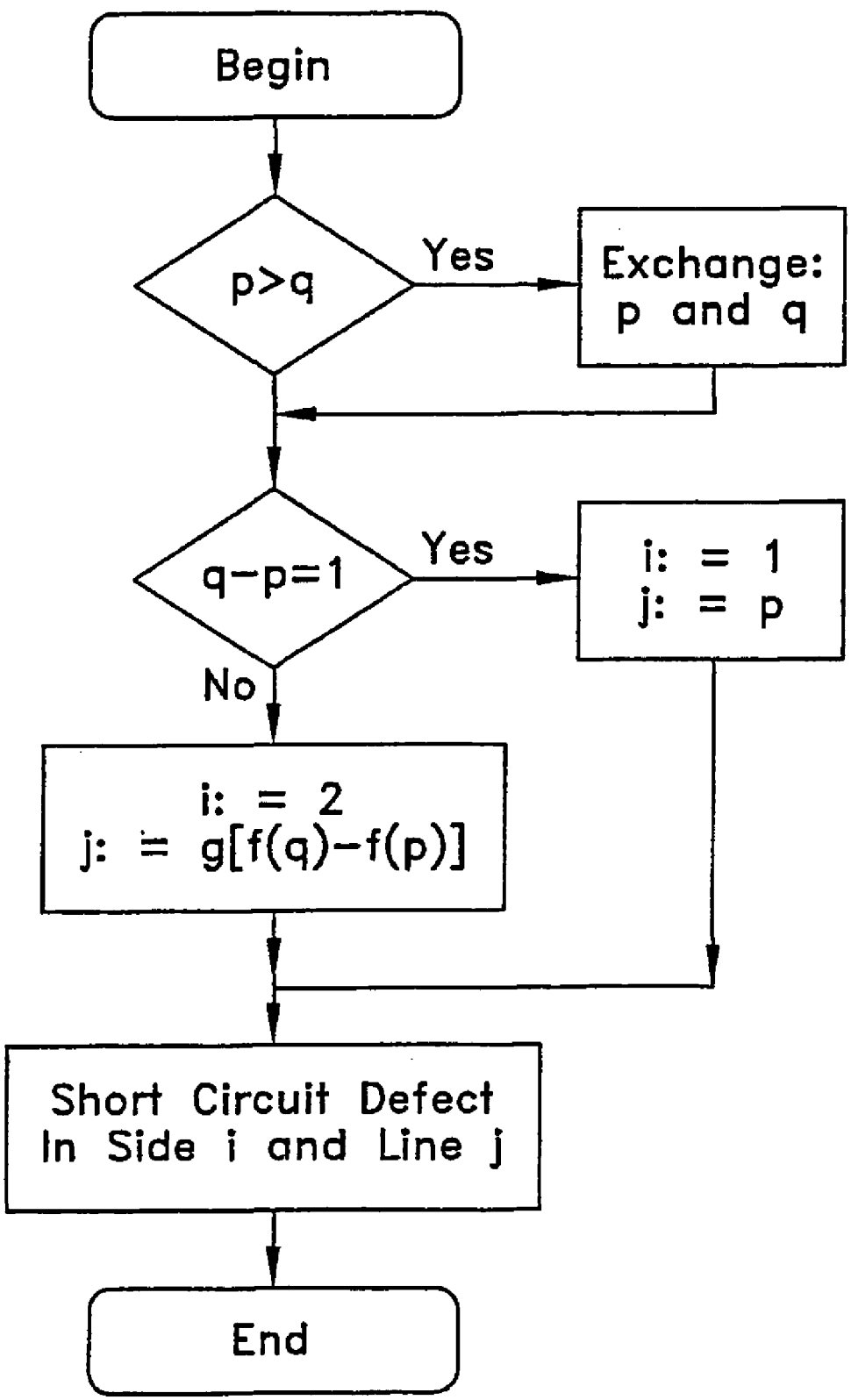
FIG. 15 is a flow chart diagram showing a method of determining in which side an identified defect occurred.

FIG. 15 is a flow chart diagram of the method for localizing a single fault. The functions called out in FIG. 15 are defined below:

$$f(x) = \begin{cases} \dfrac{x}{2} & \text{if } x \text{ is odd and } 1 < x \le m \\ m - \left[\dfrac{x-1}{2}\right] & \text{if } x \text{ is even and } 1 \le x < m \end{cases}$$

$$g(x) = \begin{cases} ((x-1) \bmod m) + 1 & \text{if } x > 0 \\ (x \bmod m) + m & \text{if } x \le 0 \end{cases}$$

If a short defect occurs, two or more lines are connected to each other. The defect can be localized inside the test structure because each pair (p,q) of lines can be clearly assigned to a unique side (e.g., top or bottom, left or right) and line index inside the 2D-Permutation Sequence. FIG. 15 contains the localization procedure for $0 \le p < q \le m$, where m stands for the number of index values inside the 2D-Matrix (m=$P_L$−1). The flowchart uses the equations given above.

If more than just two lines are connected, the following procedure will help to disentangle these multiple connection faults.

1) All possible line index pairs (p,q) are extracted from the set of connected pads in a short circuit.

2) The localization index (i,j) is determined for each pair (p,q) of lines using the flowchart of FIG. 15.

3) Then, the side of the lines is determined by combining those pairs $(p,q)_1$ and $(p,q)_2$ that have a common pad index and their localization indices meet:

(3) If there is no further combination, each side contains lines that meet:

($i_1$=$i_2$ and $|j_1$−$j_2|$=1)

or ($i_1$−$i_2$=1 and ($j_1$=0 and $j_2$=m))

or ($i_1$−$i_2$=1 and ($j_1$=0 and $j_2$=m))

4) Finally, a set of sides is selected containing the indices of all connected pads. To get a valid solution, each side within the set has at least one common pad index with at least one other side within the set. A set containing the smallest possible number of sides also indicates the minimum number of defects that have caused the measured multiple fault.

Figure 11:
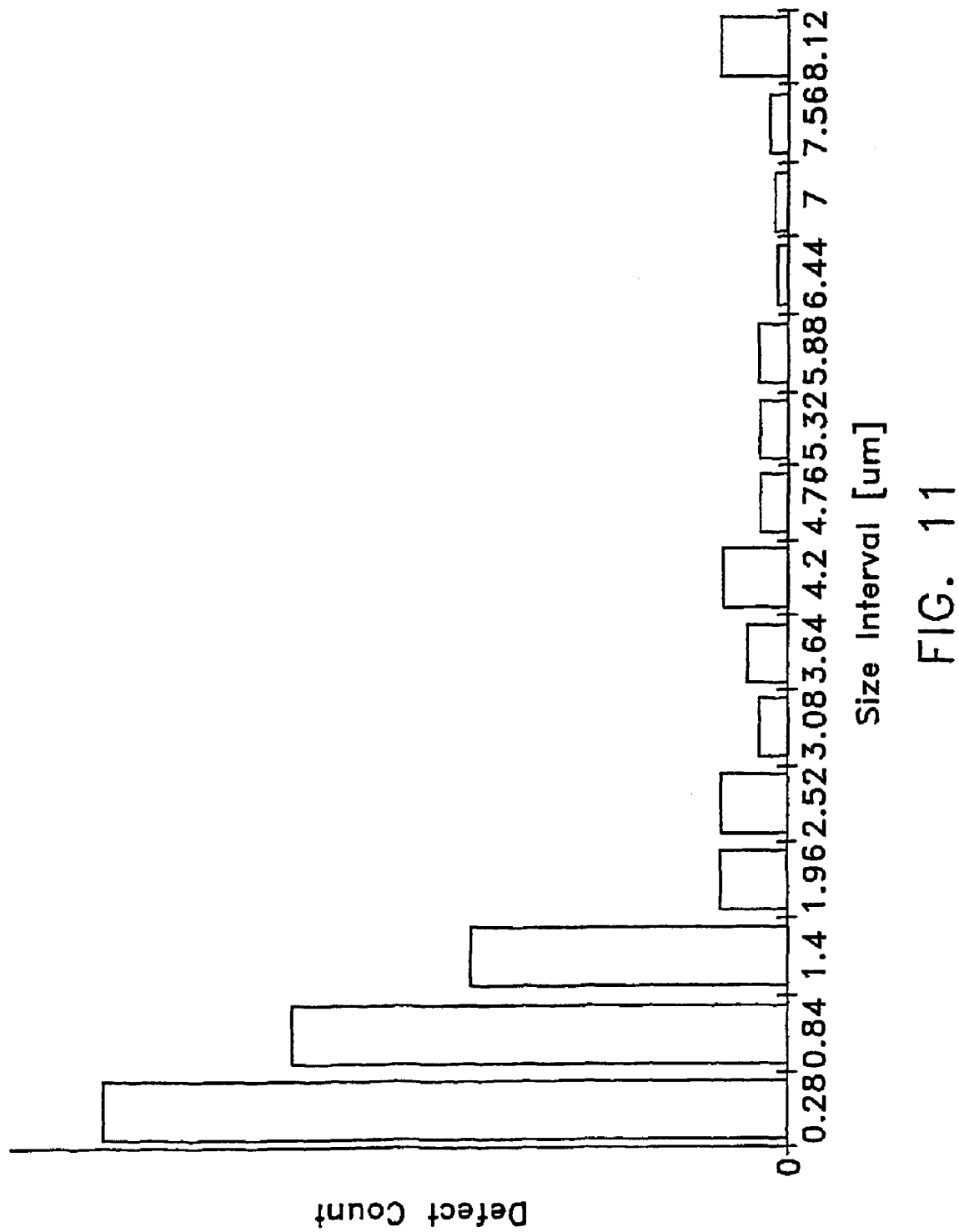
FIG. 11 is a histogram showing the distribution of defect sizes within an exemplary NEST structure.
Figure 13:
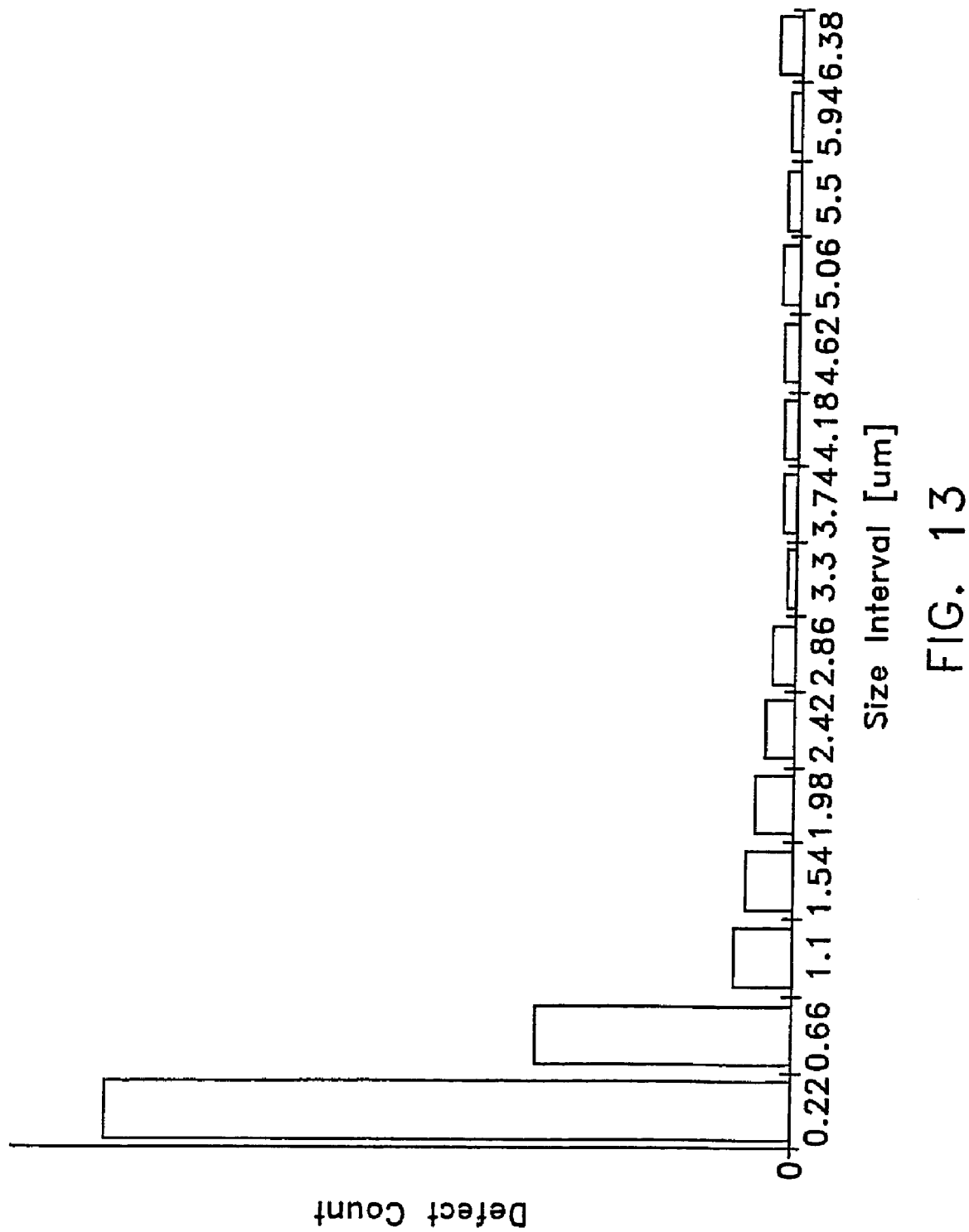
FIG. 13 is a histogram showing the distribution of defect sizes within another exemplary NEST structure.

Based on the testing procedure and defect detection method one can generate a histogram for open circuits as shown in FIG. 11, as well as a histogram for short circuits as can be seen in FIG. 13.

Data Analysis Procedure for Defect Size Modeling

Having briefly discussed the testing procedure of the NEST structure, the algorithms to extract the size distribution of such defects that have caused electrically measurable faults within NEST structures are now described.

Figure 6:
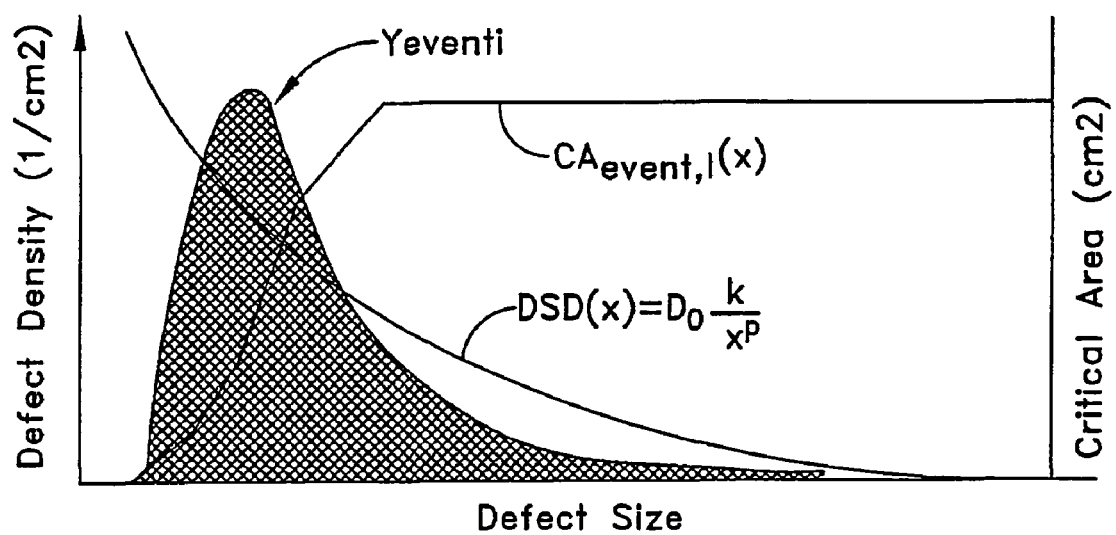
FIG. 6 is a diagram showing a defect size distribution model.

The equations described below extract the $D_0$ and p parameters of the Defect Size Distribution (DSD) function shown in FIG. 6. The Yield is given by:

$$Y_{event_i} = \exp\left(-\int_{x_0}^{\infty} CA_{event,l}(x) DSD_l(x) \, dx\right), \quad (1)$$

where CA is critical area, and DSD(x) is given by:

$$DSD(x) = D_0 \frac{k}{x^p} \quad (2)$$

Equations (1) and (2) are the (statistically based) random defect modeling equations. Equation (1) provides the predicted yield result after DSD(x) is determined from the electrical test data. The critical areas in terms of the range of defect sizes are defined and extracted from the layout. This model has been found to accurately model random defects in many deep sub-micron technologies. Auxiliary terms can be added to the model to account for different defect distributions such as clustering and systematic lithography defects.

Figure 7:
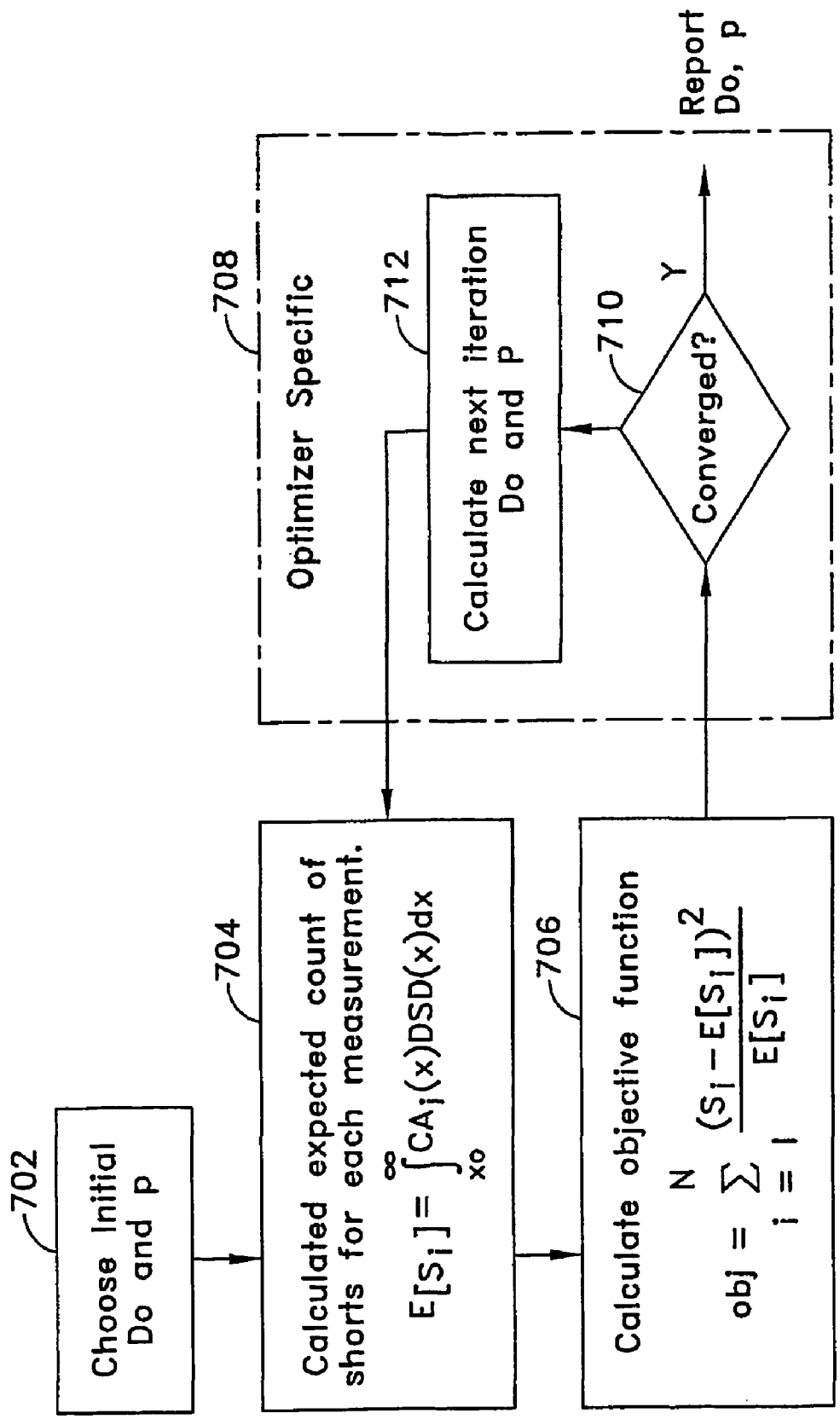
FIG. 7 is a flow chart diagram showing the method for fitting the parameters to the defect size distribution model of FIG. 6.

FIG. 7 is a flow chart showing the overall algorithm for DSD fitting. The key inputs to the equations are:

The probably of each failure event in the nests.

The critical area of each failure event (also called a "microevent")

At step 702, initial values for Do and p are chosen. The coefficients k, p, are fitted to the electrical data (as described below) and/or monte carlo simulations where algorithms are used to unravel the size distributions from the various combinations of measured shorts and opens. Then the predicted yield of equation (1) will be consistent with the observed yield Y of the characterization vehicle when the right coefficients are determined for the DSD distribution function.

At step 704, the expected count of shorts for each measurement is calculated. The defect size distribution is given by equation (2).

At step 706, the objective function is calculated, where Si is the expected count of shorts.

At step 710, a convergence check is performed. The obj function provides a normalized measure of whether the current values of Do and p provide an expected value of Si that is acceptably close to Si.

At step 712, if the algorithm has not yet converged, then new values of Do and p are selected. These new values of Do and p can be calculated using a predetermined algorithm, or chosen manually using human judgment. Steps 704–712 are then repeated until convergence is achieved.

Since the algorithm is based on the concept of critical area, it handles both extra material defects ("shorts") and missing material defects ("opens") in the same manner.

These input data are described below.

Micro-event occurrence probability extraction

There are two classes of microevents in NEST test structures:

i-line shorts i-line opens

An "i-line short" event is a type of event in which i lines are shorted together in a given sample of test data. For a simple nest, there are 15 "i-line short" events (2 adjacent lines shorted, 3 adjacent lines shorted, and so on up to 16 adjacent lines shorted). An "i-line open" event is the an event in which an open test results in i adjacent lines. Sixteen such events are possible in a simple nest (1 line open up through 16 adjacent lines open).

Microevent probabilities are calculated from the test data by counting the frequency with which electrical tests fail in adjacent lines.

Microevent Critical Area Extraction

Figure 8:
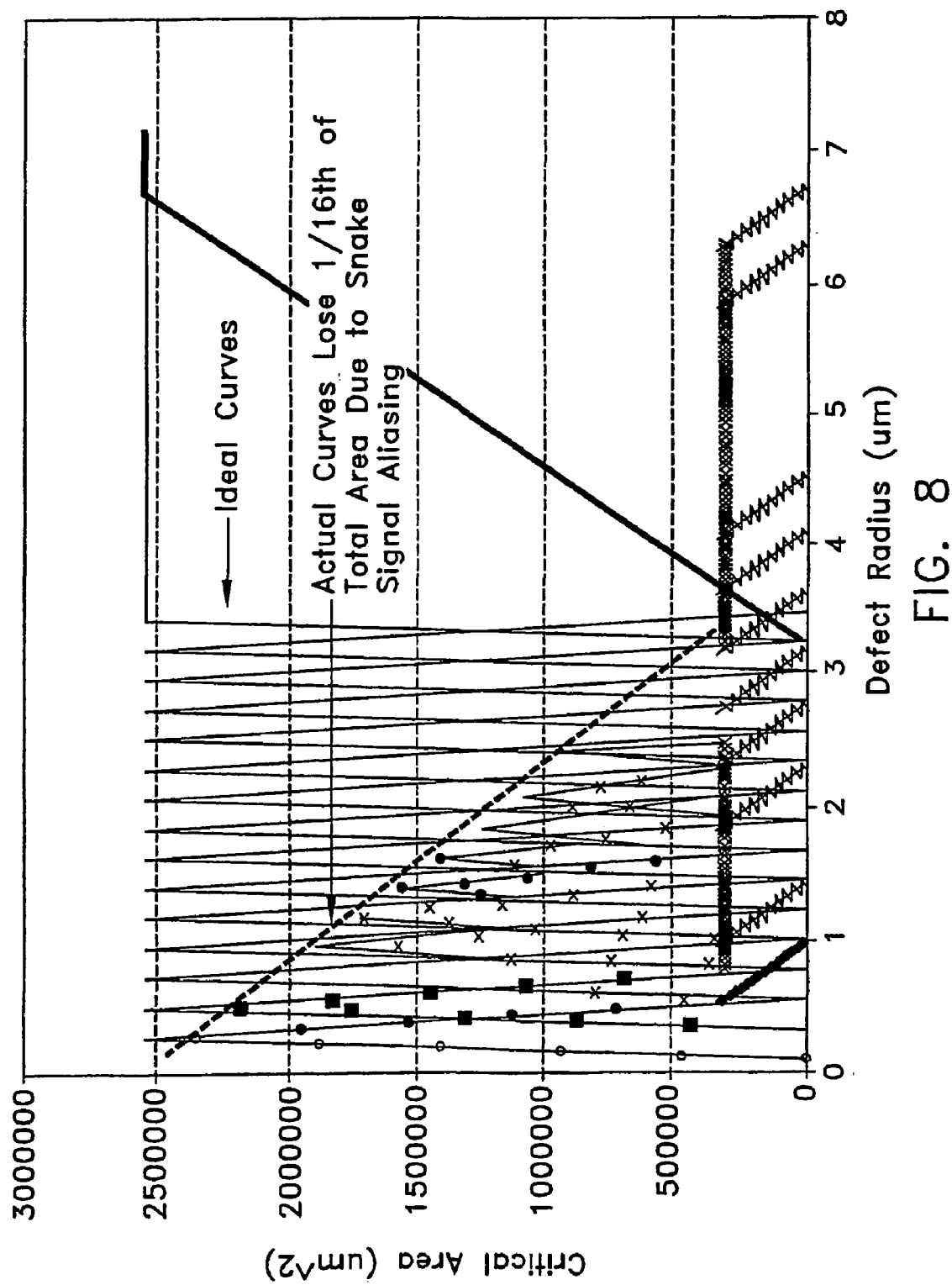
FIG. 8 is a diagram showing critical areas for multiple line short events in a 16 line nest.

FIG. 8 is a diagram showing how critical area varies with the defect radius. Note that the actual curves lose $\frac{1}{16}^{th}$ of the total area due to snake signal aliasing. Microevent critical areas are extracted according to a known algorithm. The critical areas for the 2- through 15-line shorts for a 16-line nest are shown in FIG. 8.

Accuracy of Presented Data Analysis Procedures and Experimental Results

Figure 10:
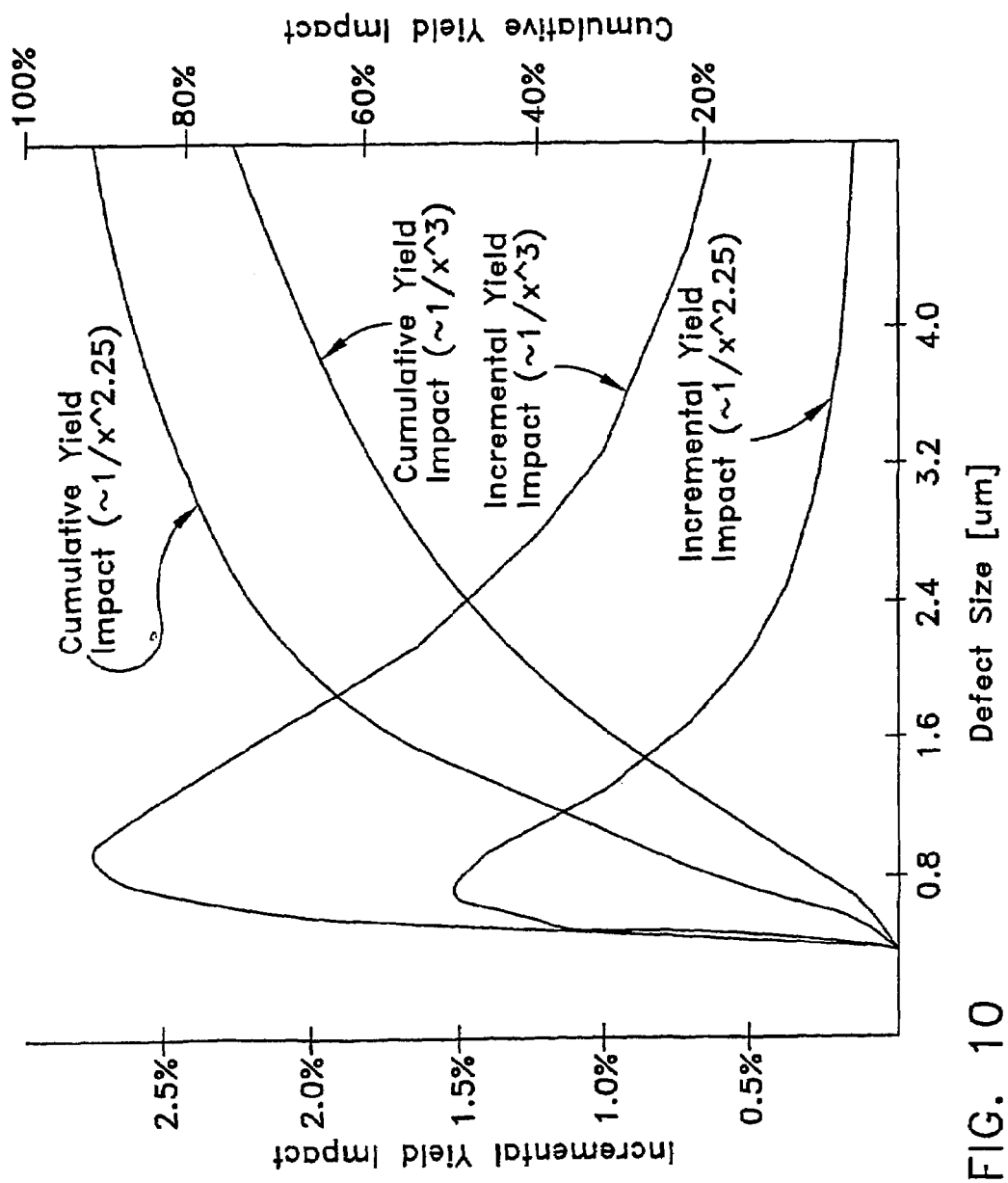
FIG. 10 shows the yield impact of various defect size distributions in a product chip.

To determine the factor p, various Monte Carlo simulations were set up for different sets of defects. Per experiment, 500 defects on average were generated and randomly placed on NEST structures having different dimensions. Based on the number of shorted lines equations (1) and (2) were used to determine a defect size distribution. Such a NEST based defect size distribution was then compared to the defect size distribution based on the actual experimental results of defects that were thrown on the NEST structures. One example for a defect distribution proportional to $1/x^{2.25}$ can be seen in FIG. 10. Another example for a defect distribution proportional to $1/x^3$ can be seen in FIG. 10.

Figure 9:
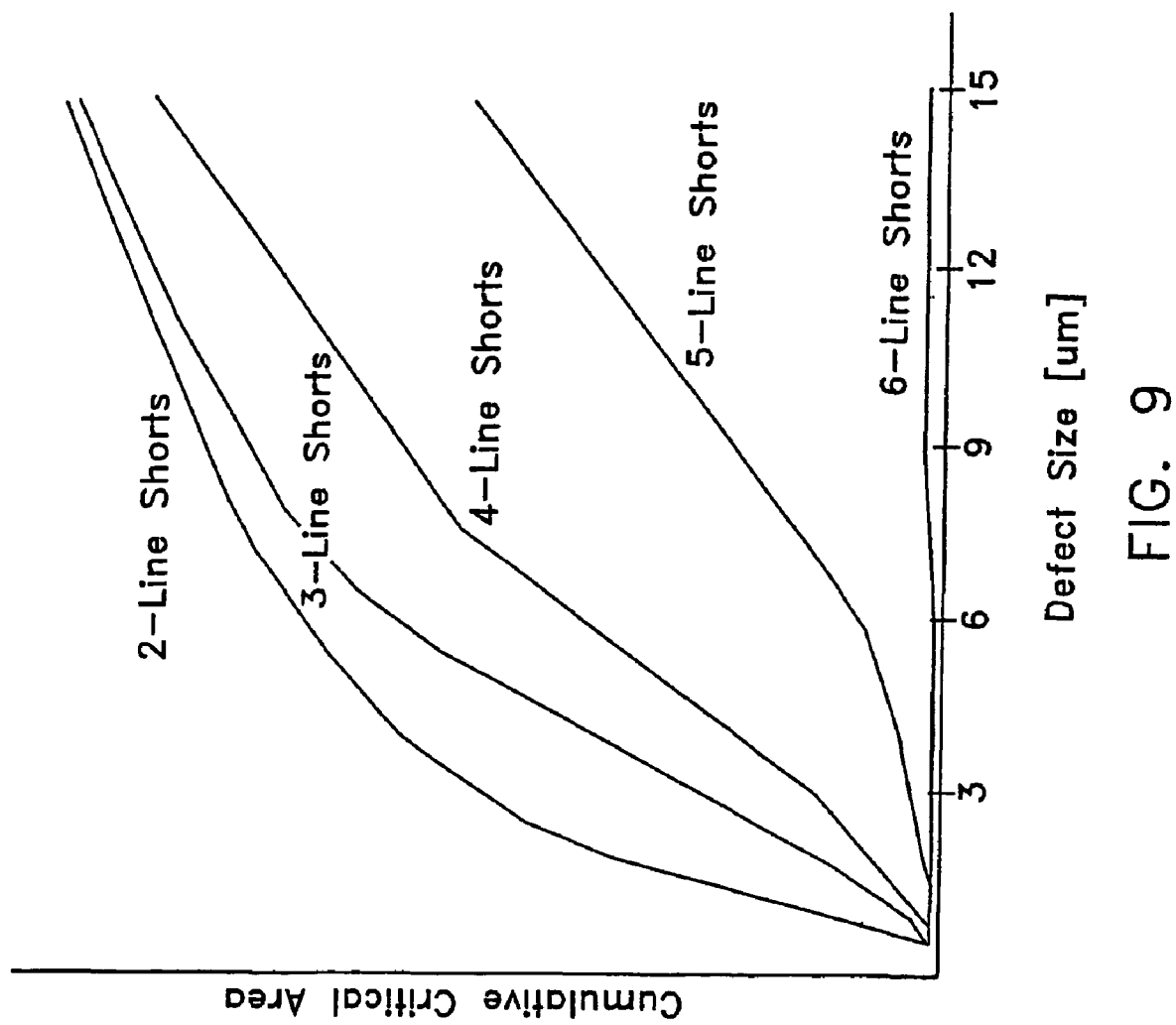
FIG. 9 is a diagram showing critical area curves for a variety of types of short circuit defects.

Except for the smallest size interval, the best fits were obtained for p=2, regardless of the defect size distributions chosen and the dimensions chosen for the NEST structures. For the smallest size interval a much smaller number of defects is observed within the NEST structure than there is in reality, because not all defects that are smaller than the line width plus twice the line space of a NEST structure actually result in electrically measurable short circuits. To evaluate whether such an error has a significant effect on yield prediction the yield impact on product chips was studied. For that, the cumulative critical area was determined for several typical product chips as one can be seen in FIG. 9. The different curves in this graph show the different cumulative critical area curves for 2 line shorts, 3-line shorts, 4-line shorts, 5-line shorts, and 6-line shorts. Only the 2-line shorts and the 3-line shorts have some critical areas in the small size region of interest. The yield impact is proportional to the integral of the critical area multiplied by the defect size distribution as can be seen in FIG. 6 for different defect size distributions. It can be seen that the yield impact for the smallest defect size interval is less than 5%. So, even a relatively large error in this region is acceptable if it comes to yield prediction.

Figure 12:
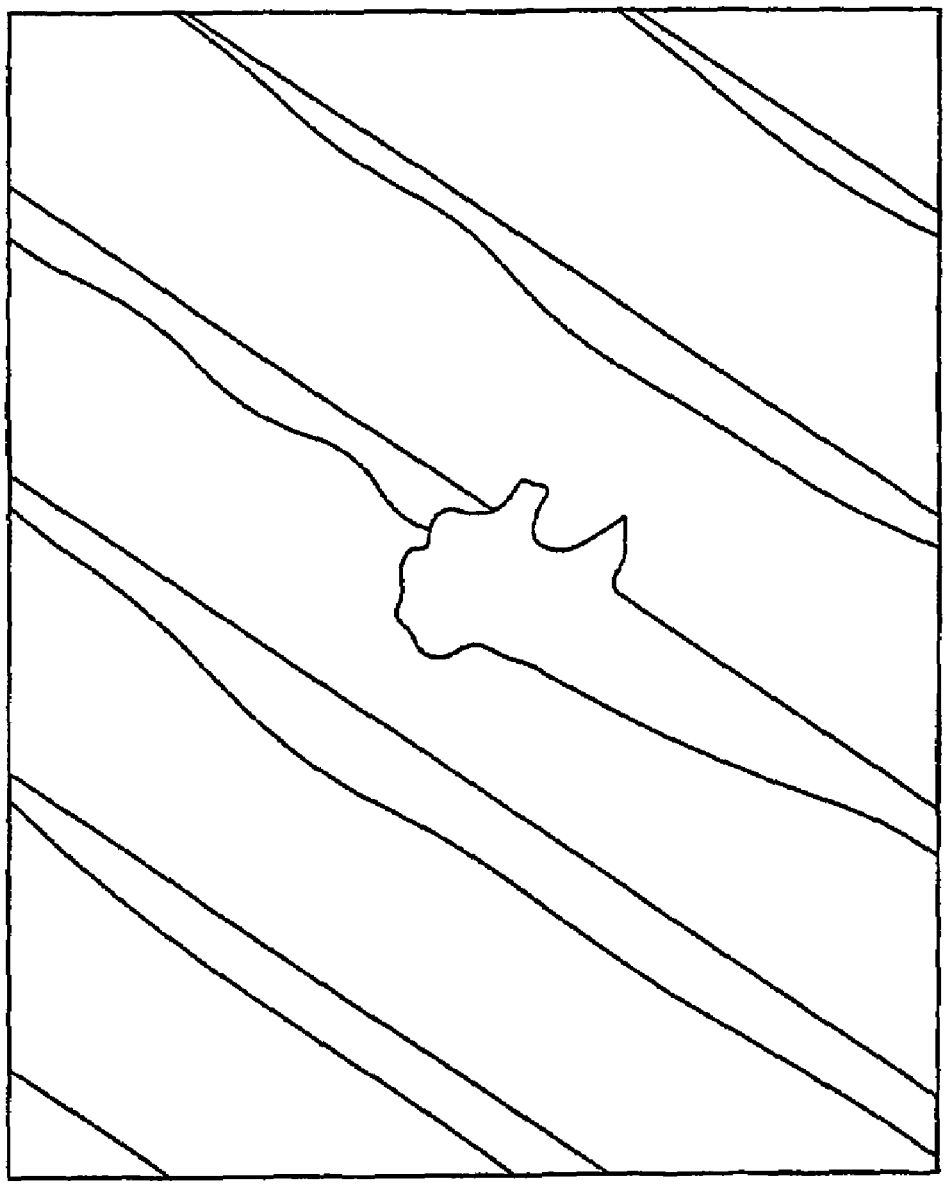
FIG. 12 is a photograph showing a detected defect causing a short circuit between two adjacent lines.
Figure 14:
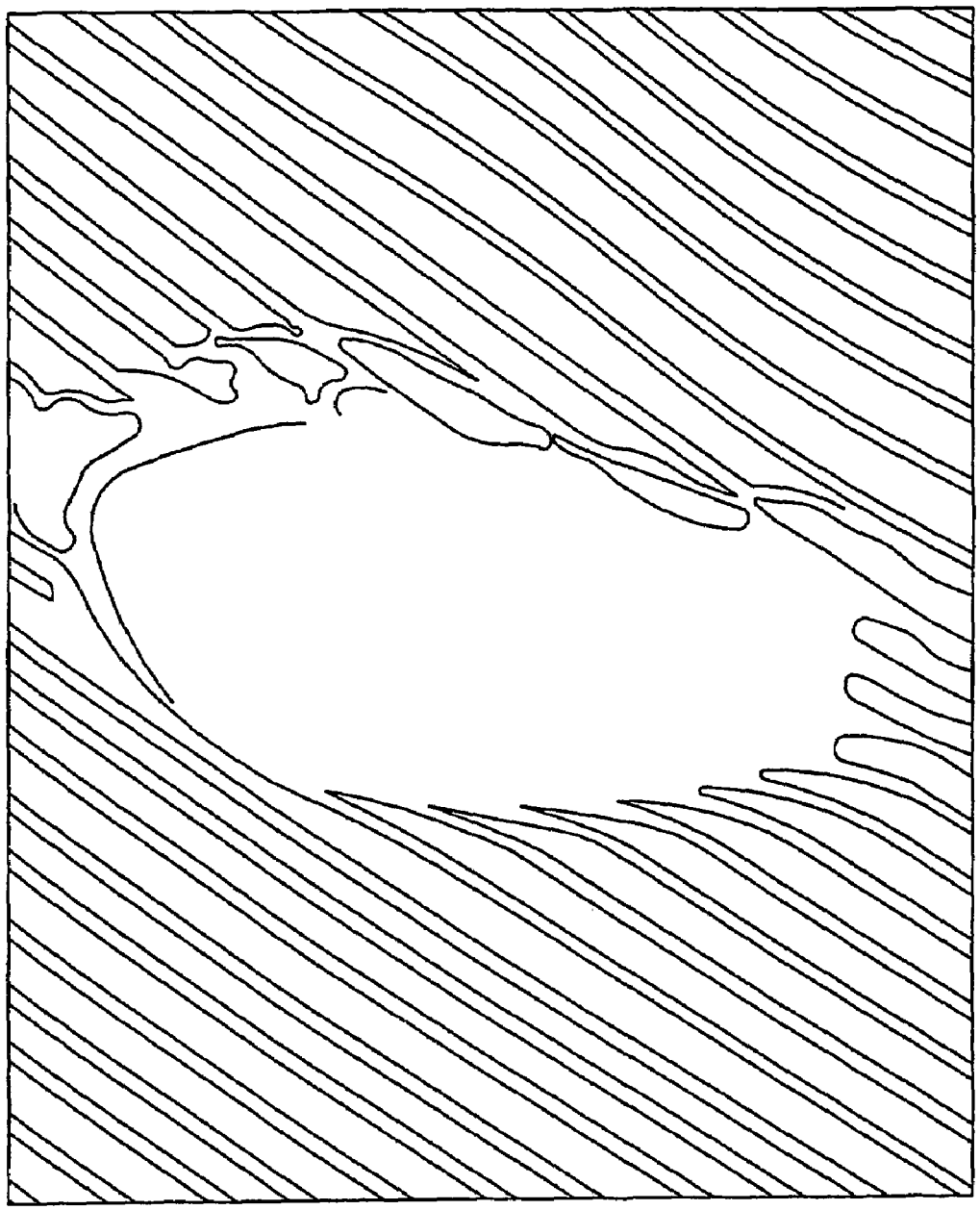
FIG. 14 is a photograph showing a detected defect causing a short circuit among eleven lines.

Many NEST structures have been manufactured in different fabrication shops world wide to control defect appearance in a deep submicron backend environment Glang, R., Defect Size Distribution in VLSI Chips, "IEEE Transactions on Semiconductor Manufacturing," referenced above, summarizes an example set of NEST structures used to extract defect size distributions. Using differently dimensioned NEST structures enables the separation of systematic and random defects. If defects occur and cause a fault, either test structure lines are connected to each other or test structure lines are interrupted. Because it is known which test structure lines are implemented as neighbors, the number and size of the defects can be determined. Based on the number of shorted lines, the algorithms above can be applied to determine a defect size distribution as can be seen in FIGS. 11 and 13. SEM pictures of two detected defects can be seen in FIGS. 12 and 14. The same principle could be applied for opens, but the observed defect density was too small to actually generate a significant defect size histogram.

TABLE 1

| Line Pitch (µm) | No. of Parallel Lines Per Structure | Area Per Structure (mm²) | Pads Per Structure |
|---|---|---|---|
| 0.4 | 4992 | 2.4 | 2 by 16 |
| 0.44 | 4544 | 2.4 | 2 by 16 |
| 0.48 | 4160 | 2.4 | 2 by 16 |
| 0.56 | 3552 | 2.4 | 2 by 16 |
| 0.65 | 3104 | 2.4 | 2 by 16 |

Although the invention has been described in terms of exemplary embodiments, it is not limited thereto. Rather, the appended claims should be construed broadly, to include other variants and embodiments, which may be made by those skilled in the art without departing from the scope and range of equivalents of the invention.

What is claimed is:

1. A characterization vehicle, comprising:
a substrate having at least one layer; and
a plurality of pairs of lines on a single surface of a single layer of the substrate, each pair of lines having a shared pad therebetween.

2. The characterization vehicle of claim 1, wherein the lines are nested serpentine lines.

3. The characterization vehicle of claim 2, wherein none of the nested serpentine lines crosses any other one of the nested serpentine lines.

4. The characterization vehicle of claim 2, wherein the nested serpentine lines within each pair are not adjacent to each other.

5. The characterization vehicle of claim 2, wherein:
each pair of lines includes a respective first line and a respective second line;
the first lines are arranged in a first sequence; and
the second lines are arranged in a second sequence different from the first sequence.

6. The characterization vehicle of claim 5, wherein:
each first line has a respective position within the first sequence;
each second line has a respective position within the second sequence; and
within each pair of lines, the position of the second line within the second sequence is different from the position of the corresponding first line within the first sequence.

7. The characterization vehicle of claim 5, wherein:
the first line in each pair is adjacent to one or more neighboring first lines;
the second line in each pair is adjacent to one or more neighboring second lines; and
the one or more neighboring second lines corresponding to the second line in each respective pair belong to different pairs of lines than the one or more neighboring lines corresponding to the first line in that pair.

8. The characterization vehicle of claim 5, wherein:
for each position, the first line having that position in the first sequence belongs to a different pair of lines than the second line having that position within the second sequence.

9. The characterization vehicle of claim 2, wherein:
the surface has first and second sides;
each pair of nested serpentine lines includes a first line and a second line, such that:
the first line extends beyond the pads on the first side of the surface;
the second line extends beyond the pads on the second side of the surface; and
none of the nested serpentine lines crosses any other one of the nested serpentine lines.

10. A method of designing a characterization vehicle, comprising the steps of:
arranging a plurality of pairs of lines on a single surface of a single layer of a substrate; and
locating a respective shared pad between the lines of each pair of lines.

11. The method of claim 10, wherein the lines are nested serpentine lines.

12. The method of claim 11, wherein none of the nested serpentine lines crosses any other one of the nested serpentine lines.

13. The method of claim 11, wherein the nested serpentine lines within each pair are not adjacent to each other.

14. The method of claim 11, wherein:
each pair of lines includes a respective first line and a respective second line;
the first lines are arranged in a first sequence; and
the second lines are arranged in a second sequence different from the first sequence.

15. The method of claim 14, wherein:
each first line has a respective position within the first sequence;
each second line has a respective position within the second sequence; and
within each pair of lines, the position of the second line within the second sequence is different from the position of the corresponding first line within the first sequence.

16. The method of claim 14, wherein:
the first line in each pair is adjacent to one or more neighboring first lines;
the second line in each pair is adjacent to one or more neighboring second lines; and
the one or more neighboring second lines corresponding to the second line in each respective pair belong to different pairs of lines than the one or more neighboring lines corresponding to the first line in that pair.

17. A method of identifying defects, comprising the steps of:
fabricating a characterization vehicle by forming a plurality of pairs of lines on a single surface of a single layer of a substrate, each pair of lines having a shared pad therebetween; and
collecting defect data from the characterization vehicle.

18. The method of claim 17, wherein the lines are nested serpentine lines.

19. The method of claim 18, further comprising determining which one of a pair of serpentine lines sharing a pad therebetween has a defect by identifying a sequence of serpentine lines that are shorted together.

20. A method of determining defect size distributions, comprising the steps of:
(a) collecting defect size distributions from a characterization vehicle by forming a plurality of pairs of lines on a single surface of a single layer of a substrate, each pair of lines having a shared pad therebetween; and
(b) determining which one of a pair of lines sharing a pad therebetween has a defect by identifying a sequence of the lines that are shorted together.

21. The method of claim 20, wherein the lines are nested serpentine lines.

22. The method of claim 21, wherein step (a) includes forming a histogram of a number of defects detected versus defect size.

23. The method of claim 21, wherein step (a) includes forming a histogram of a number of defects detected versus defect size.

24. The method of claim 23, further comprising using a defect density function to form a yield model.

* * * * *